United States Patent [19]

Parks et al.

[11] 4,001,604
[45] Jan. 4, 1977

[54] PEAK VALUE DETECTOR

[75] Inventors: Jack G. Parks, Troy; Gordon J. McInnes, Clarkston, both of Mich.

[73] Assignee: The United States of America as represented by the Secretary of the Army, Washington, D.C.

[22] Filed: Apr. 25, 1975

[21] Appl. No.: 571,671

[52] U.S. Cl. .................. 307/235 A; 307/235 C; 307/251; 328/28; 340/347 AD; 340/347 SH
[51] Int. Cl.² .................. H03K 5/13; H03K 13/02; H03K 5/153; H03K 17/60
[58] Field of Search ....... 307/235 A, 235 C, 235 K, 307/251; 328/151, 13, 14, 28, 29; 340/347 AD, 347 SH; 324/103 P

[56] References Cited

UNITED STATES PATENTS

| | | | |
|---|---|---|---|
| 3,474,259 | 10/1969 | Rodgers | 328/151 X |
| 3,521,141 | 7/1970 | Walton | 328/151 X |
| 3,784,921 | 1/1974 | Iadipaolo | 328/151 X |
| 3,820,033 | 6/1974 | Iwata | 328/151 |
| 3,839,680 | 10/1974 | Backman, Jr. | 307/235 A X |
| 3,882,489 | 5/1975 | Guggolz | 307/235 A X |
| 3,891,930 | 6/1975 | Petrusson | 307/235 A X |

OTHER PUBLICATIONS

McCullough et al., "Peak Detection and Holding System," *IBM Tech. Discl. Bull.,* vol. 8, No. 10, pp. 1450–1451; 3/1966.
Smith et al., "Peak and Valley Detector," *IBM Tech. Discl. Bull.;* vol. 8, No. 6, pp. 910–911; 11/1965.
Bidwell et al., "Peak Detector and Average Detector," *IBM Tech. Discl. Bull.;* vol. 9, No. 4, pp. 426–428; 9/1966.
Peach et al., "Peak-Shift Measurements," *IBM Tech. Discl. Bull.;* vol. 13, No. 9, pp. 2728–2729; 2/1971.

*Primary Examiner*—John S. Heyman
*Assistant Examiner*—Larry N. Anagnos
*Attorney, Agent, or Firm*—Peter A. Taucher; John E. McRae; Nathan Edelberg

[57] ABSTRACT

A circuit for detecting peaks in a time-variant signal, comprising a track-hold unit having a first mode for tracking the time-variant signal, and a second mode for storing instantaneous peak values. The track-hold unit is controlled by a comparator which samples the time-variant signal and stored peak; logic output of the comparator is applied to the track-hold unit to direct it into its first or second modes in accordance with the relative values of the sampled signals.

5 Claims, 3 Drawing Figures

PEAK VALUE DETECTOR

The invention described herein may be manufactured, used and licensed by or for the Government for governmental purposes without payment to us of any royalty thereon.

BACKGROUND AND SUMMARY OF THE INVENTION

It is sometimes necessary or desirable to detect the occurrence and magnitude of a time-variant signal, as for example signals representing electrochemical activity, or signals derived from pressure pulses in hydraulic systems, or signals developed in response to variations in temperature (thermistor), or signals related to seismic activity, etc.

Traditionally the time-variant signal is passed through a diode to a capacitor for storage as a peak. However the common diode-capacitor system is not completely satisfactory. For example, the forward voltage drop across the diode is variable and indeterminate; also, the capacitor charge rate is affected by the output impedance of the driving circuit; also the capacitor discharge rate is affected by the input impedance of the following circuitry; also, the time of occurrence of the peak is usually not ascertainable; also, the stored signal is not in readily usable digital form; additionally the stored signal "droops" in a time-dependent fashion.

At least one commercially available detector, the Burr-Brown model 4084/25 has been developed which overcomes some of the above-noted deficiencies. That detector is a fully encapsulated module using diode-logic circuitry; buffer amplifiers are employed to isolate the capacitor from the driving circuit and the following circuit, and to provide compensation for variable voltage drops across the diode. The Burr-Brown unit is believed to have certain disadvantages, as for example no capability for repair or alteration of operational response, and no digital output; in the Burr-Brown unit the stored analog signal tends to droop as the capacitor slowly discharges from its state of highest charge.

The present invention seeks to provide a peak detector circuit that overcomes some or all of the above-noted disadvantages. The circuit is made up of standard "shelf" items, thus facilitating repair or replacement of malfunctioning items, and minimizing circuit cost and fabrication time. The circuitry design provides flexibility in operational response to different environmental conditions, i.e. a "fast" detector responding to high frequency signals or a "slow" detector responding to low frequency signals, achieved by the use of components of the appropriate high or low performance characteristics. In a preferred arrangement the peak detector is employed with an analog-digital converter which translates the detector analog output into a digital form that is readily usable in present day computers, and which alleviates the problem of signal "droop".

THE DRAWINGS

FIG. 1 schematically illustrates a detector circuit embodying the invention.

FIGS. 1 AND 2

Figure 1:
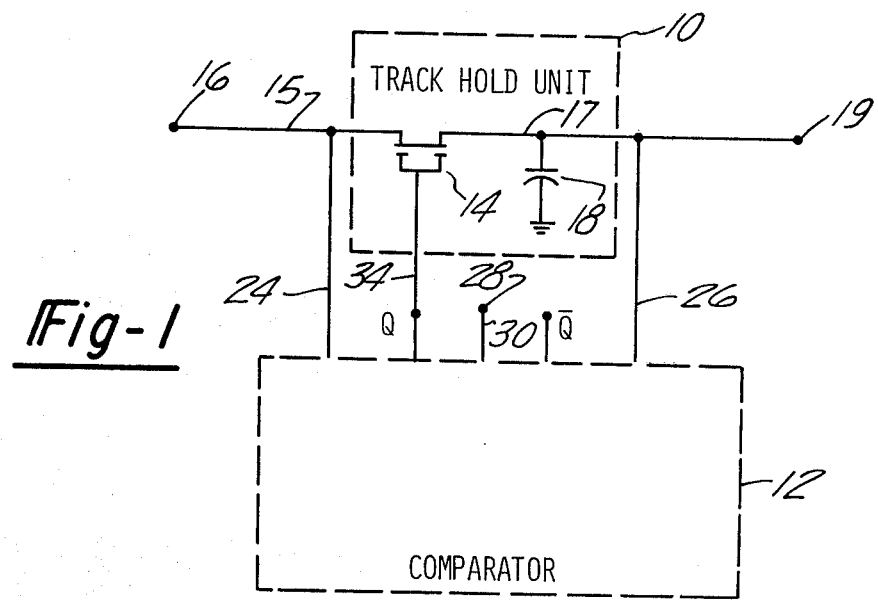

FIG. 1 diagrammatically illustrates a peak detector comprising two conventional "shelf" items, namely the track-hold unit 10 and the comparator 12. Unit 10 can take any suitable form, as for example the form shown in U.S. Pat. No. 3,764,921 issued to G. Huard. Comparator 12 can likewise take any suitable form, as for example that shown in U.S. Pat. No. 3,848,139 issued to J. G. Holt. Note that the complexity inherent to unit 10 or unit 12 is not apparent to the user. Preferably, the user purchases and applies these units as "modules", and is unconcerned about their internal workings.

As shown in the attached drawing the track-hold unit includes a bi-stable gated switch 14 constructed as a field effect transistor. The source terminal of transistor 14 is connected through line 15 to a terminal 16 adapted to receive the time-variant signal from a suitable transducer or signal source (not shown). The drain terminal of transistor 14 is connected through line 17 to a signal storage means, shown as a capacitor 18. Detector readout is by means of an output terminal 19.

Comparator 12 may be comprised of two field effect transistors, whose gate terminals are connected respectively to lines 15 and 17 by means of conductors 24 and 26. An externally supplied bias voltage (e.g. 5 volts) at terminal 28 is directed through line 30 to the source electrode of each transistor in the comparator. Assuming the time-variant signal at input terminal 16 is instantaneously greater than the stored signal at output terminal 19, then one transistor is fired while the other transistor is held off; under these circumstances the comparator delivers a logic 1 signal through line 34 to the gate of switch 14. The switch 14 is thereby placed in the "conducting" or "tracking" mode of operation wherein the time-variant signal is conducted from terminal 16 through switch 14 to storage means 18.

When or if the voltage in line 17 increases to the level then prevailing in line 15 the turned-on transistor is turned off, and the other transistor is turned on. Line 34 then delivers a logic O signal to the gate of switch 14, thereby placing the switch in the non-conducting or "holding" mode of operation in which storage means 18 is isolated from terminal 16.

Figure 2:
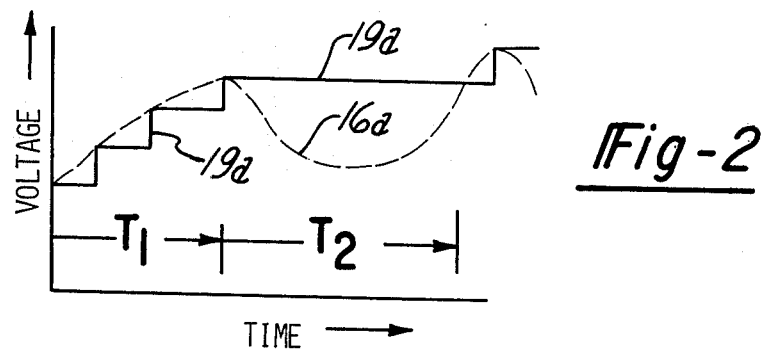
FIG. 2 is a time-voltage graph describing the operation of the FIG. 1 circuit.

FIG. 2 is a plot of voltage vs time for two voltages. The dotted line 16a plots the analog signal existing at input terminal 16 over a representative period of time. The solid line 19a plots the output voltage at terminal 19 resulting from the interraction of comparator 12 and track-hold unit 10. The output at terminal 19 holds each peak voltage occurring at terminal 16; thus, peaks occurring at terminal 16 during time interval $T_1$ can be detected and held at output terminal 19 after the voltage at terminal 16 has decreased or dipped, as during time interval $T_2$. The horizontal line segments in line 19a occur while unit 10 is in its holding mode. The vertical line segments in line 19a occur while unit 10 is in its tracking mode. The height of each vertical line segment is in each case the same; it represents the minimum voltage difference between terminals 16 and 19 that is detectable by unit 12, and which subsequently causes a change in the mode of unit 10.

Figure 3:
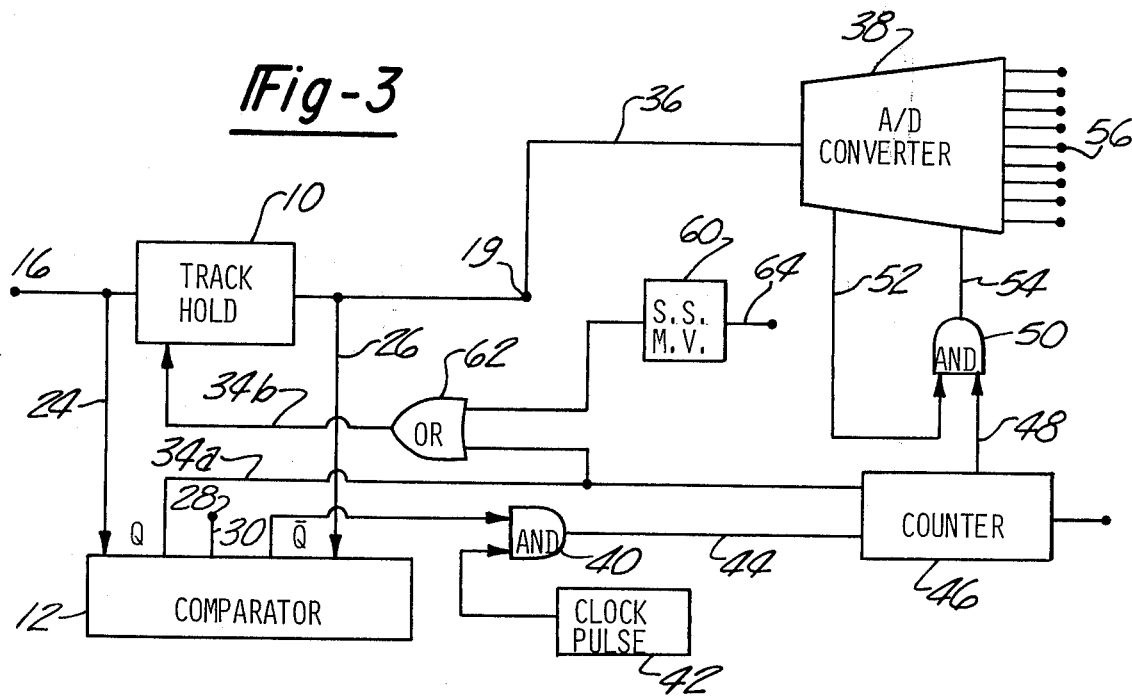
FIG. 3 illustrates the FIG. 1 detector used with an analogdigital converter for making the output "computer compatible".

FIG. 3 illustrates an arrangement of conventional circuit elements for converting the analog signal at terminal 19 into digital form. The signal is conducted through line 36 to the analog-digital converter 38 which is indirectly controlled by comparator 12 through counter 46 so that conversion occurs only when the trackhold unit 10 is in the holding mode; the aim is to prevent transient short-duration pulses generated when the peak detector is "searching" (oscillating rapidly between the hold and track modes) for a peak from being erroneously converted as a valid peak.

Comparator 12 is arranged so that its inverted output $\bar{Q}$ is fed to an AND gate 40 which also receives an input from clock pulse source 42. Output $\bar{Q}$ only goes "high" when unit 10 is in the hold mode; $\bar{Q}$ may be viewed as an "enable" signal that allows the clock pulses to propagate through AND gate 40. Assuming $\bar{Q}$ is high, inputs from pulse unit 42 are delivered through line 44 to a counter 46, which delivers an output signal through line 48 after the elapse of a predetermined number of clock pulses; the number of clock pulses required to produce one counter output signal is pre-selected by the user in relation to the response time of analog-digital converter 38 and the signal droop characteristics of unit 10. The number of clock pulses to produce one counter 46 output signal should be sufficient to allow converter 38 to convert the previous signal from unit 10, yet not so great as to permit the unit 10 signal to droop in any significant degree; a dozen clock pulses would be sufficient in many instances. Note that this user selectable delay period allows A/D converters and T/H units of widely varying speeds to be accommodated.

If, at any time before the user-selected number of counts occurs, $\bar{Q}$ changes from "high" to "low" (indicating a voltage higher than that stored is present at terminal 16), the counter is reset by line 34a to zero counts, and the process must begin all over again when $\bar{Q}$ again goes high.

The counter 46 output signal is fed to an AND gate 50 which also receives a signal input from converter 38 through its "ready to convert" line 52. Assuming simultaneous "ready to convert" signal from line 52 and an "initiate" signal from counter 46 through line 48, the AND gate produces a signal in line 54 which commands the converter to go into its "convert" mode. The digital output is produced at parallel output terminals 56.

It will be noted that counter 46 continuously interacts with the comparator 12 and converter 38 to periodically cause the converter to go into its "convert" mode. The digital output is formed before the analog signal 19 can droop, and the digital value is held by the A/D unit until commanded to convert a new peak value. Droop is a function of the magnitude of capacitor 18 and the impedance of its discharge paths. Errors associated with droop are alleviated by converting the analog voltage at terminal 19 into the digital mode before the error magnitude caused by the droop becomes significant.

Inclusion of the AND gate 40 ensures that each clock pulse will be counted only when the comparator tells the counter that the track-hold unit is in its holding mode. This action ensures that the converter will convert only the stored peak signal, thus discriminating against transient noise peaks at terminal 16 or "flicker" signals that might exist at terminal 19.

Advantageously the computer (not shown) should have the capability of controlling the peak detector by discarding the stored peak signal and initiating a new or different period of operation. The so-called "reset" operation may be accomplished by placing the track-hold unit 10 in its tracking mode for a period of time sufficient to allow capacitor 18 to discharge the stored signal, i.e. to assume the same voltage as input terminal 16. In the FIG. 3 circuit arrangement the reset mechanism comprises a single shot multi-vibrator 60 arranged to provide an input signal to an OR gate 62. The other input to OR gate 62 is provided by the comparator output Q. Assuming the computer applies a reset pulse to single shot vibrator 60 through line 64 to temporarily place the vibrator output in a logic 1 condition, then the gate 62 output will be continuously in a logic 1 condition irrespective of the condition of the signal in line 34a. Therefore track-hold unit 10 is forced into the tracking mode for the duration of the pulse produced by element 60. When element 60 discharges, its output goes to a logic O state, and the signal in line 34a effectively resumes control over the track-hold unit.

The circuitry shown and described responds to voltage peaks of only one polarity (e.g. positive polarity). However it is possible by adding a second track-hold unit to simultaneously detect and hold negative and positive peaks. Preferably the circuitry is fabricated from standard shelf items to permit easier repair and design versatility. Principal advantages of the circuitry are digital output (computer compatibility), and lack of output signal droop.

We wish it to be understood that we do not desire to be limited to the exact details of construction shown and described for obvious modifications will occur to a person skilled in the art.

We claim:

1. A circuit for detecting peaks in a time-variant analog signal and converting same to digital form, comprising:

a track-hold unit having an input (16) adapted to receive the time-variant signal, a signal storage means (18), a bistable gated switch (14), having a gate terminal, for alternately conducting the time-variant signal to the storage means or isolating the storage means from the time-variant signal, and output terminal (19) continuously connected to the storage means for delivering the stored signal;

a comparator for comparing the time-variant signal and stored signal, said comparator having a first input terminal (24) connected to said track-hold unit input terminal (16), a second input terminal (26) connected to said track-hold unit output terminal (19), a first output terminal producing a first logic output signal (Q) when the time-variant signal exceeds the stored signal, and producing at a second output terminal a second logic output signal ($\bar{Q}$) when the stored signal equals or exceeds the time-variant signal;

circuit means (34a and 34b) responsive to said first logic output signal for applying said first logic signal to the gate terminal of said bistable switch, whereby said switch (14) is in its conducting state only when the time-variant signal exceeds the stored signal; a converter (38) for converting the stored time-variant signal at said track-hold unit output (19) to digital form; said converter having convert-control circuitry (50, 52, 54);

an additional circuit means (44 and 48) coupled to said comparator second output terminal for applying said second logic output signal ($\bar{Q}$) to said convert control circuitry whereby the converter is put into the convert mode only when the stored signal equals or exceeds the time-variant signal.

2. The circuit of claim 1: and further comprising reset pulse means (60, 62) for temporarily directing the bistable switch into its conducting state irrespective of the nature of the comparator output.

3. The circuit of claim 2: the reset pulse means comprising a monostable multivibrator, and an OR gate; the OR gate responsive to inputs received from the multivibrator and said comparator first logic output terminal, the OR gate delivering its output to the gate of switch 14.

4. The circuit of claim 1: the combination further comprising means (40, 42) for translating said second logic output signal into discrete pulses; and a pulse counter (46) delivering an output signal to the aforementioned convert control circuitry after it has received a predetermined number of input pulses from the translating means.

5. The circuit of claim 4: the translating means comprising a clock pulse means (42) and an AND gate (40) receiving inputs from the clock pulse means and said comparator second output terminal.

* * * * *